US007960257B2

(12) United States Patent
Nakayama et al.

(10) Patent No.: US 7,960,257 B2
(45) Date of Patent: Jun. 14, 2011

(54) SILICON CARBIDE SEMICONDUCTOR DEVICE AND MANUFACTURING METHOD THEREFOR

(75) Inventors: Koji Nakayama, Osaka (JP); Yoshitaka Sugawara, Osaka (JP); Katsunori Asano, Osaka (JP); Hidekazu Tsuchida, Yokosuka (JP); Isaho Kamata, Yokosuka (JP); Toshiyuki Miyanagi, Yokosuka (JP); Tomonori Nakamura, Yokosuka (JP)

(73) Assignees: The Kansai Electric Power Co., Inc., Osaka (JP); Central Research Institute of Electric Power Industry, Tokyo (JP)

( * ) Notice: Subject to any disclaimer, the term of this patent is extended or adjusted under 35 U.S.C. 154(b) by 0 days.

(21) Appl. No.: 12/801,680

(22) Filed: Jun. 21, 2010

(65) Prior Publication Data

US 2010/0261333 A1    Oct. 14, 2010

Related U.S. Application Data

(62) Division of application No. 10/581,247, filed as application No. PCT/JP2004/017888 on Dec. 1, 2004, now Pat. No. 7,768,017.

(30) Foreign Application Priority Data

Dec. 3, 2003  (JP) ................ 2003-405259

(51) Int. Cl.
  *H01L 21/20*    (2006.01)
  *H01L 21/36*    (2006.01)
(52) U.S. Cl. .......... 438/478; 438/479; 257/77; 257/741; 257/761; 257/763; 257/765

(58) Field of Classification Search .......... 438/478–509; 257/77, 741, 761, 763, 765
See application file for complete search history.

(56) References Cited

U.S. PATENT DOCUMENTS

| 5,958,132 A | 9/1999 | Takahashi et al. |
| 6,121,633 A | 9/2000 | Singh et al. |
| 6,461,927 B1 | 10/2002 | Mochizuki et al. |
| 6,734,461 B1 | 5/2004 | Shiomi et al. |
| 2003/0080384 A1 | 5/2003 | Takahashi et al. |
| 2005/0145971 A1 | 7/2005 | Okamura et al. |

(Continued)

FOREIGN PATENT DOCUMENTS

EP    1 215 730 A1    6/2002

(Continued)

OTHER PUBLICATIONS

International Search Report for PCT/JP2004/017888 dated Mar. 1, 2005.

(Continued)

*Primary Examiner* — Zandra Smith
*Assistant Examiner* — Telly D Green
(74) *Attorney, Agent, or Firm* — Nixon & Vanderhye, P.C.

(57) ABSTRACT

With a view to preventing increases in forward voltage due to a change with the lapse of time of a bipolar semiconductor device using a silicon carbide semiconductor, a buffer layer, a drift layer and other p-type and n-type semiconductor layers are formed on a growth surface, which is given by a surface of a crystal of a silicon carbide semiconductor having an off-angle θ of 8 degrees from a (000-1) carbon surface of the crystal, at a film growth rate having a film-thickness increasing rate per hour h of 10 μm/h, which is three times or more higher than conventional counterparts. The flow rate of silane and propane material gases and dopant gases is largely increased to enhance the film growth rate.

3 Claims, 7 Drawing Sheets

FOREIGN PATENT DOCUMENTS

| | | |
|---|---|---|
| JP | 03-171772 | 7/1991 |
| JP | 7-267795 A | 10/1995 |
| JP | 11-060390 | 3/1999 |
| JP | 11-060390 A | 3/1999 |
| JP | 03-171772 A | 7/1999 |
| JP | 2000-001398 | 1/2000 |
| JP | 2000-001398 A | 1/2000 |
| JP | 2000-323491 A | 11/2000 |
| JP | 2002-514355 | 5/2002 |
| JP | 2002-514355 A | 5/2002 |
| JP | 2002-252344 A | 9/2002 |
| JP | 2003-318185 A | 11/2003 |
| WO | 95/34915 A | 12/1995 |
| WO | 01/18872 | 3/2001 |
| WO | 01/18872 A1 | 3/2001 |
| WO | 03/038876 A1 | 5/2003 |

OTHER PUBLICATIONS

Translation of the International Preliminary Report on Patentability mailed Aug. 3, 2006 in corresponding PCT application No. PCT/JP2004/017888.

Matsunami, "Semiconductor SiC Technology and Applications", Nikkan Kogyo Shimbunsha, pp. 218-221.

Agarwal et al, "Dynamic Performance of 3.1 kV 4H-SiC Asymmetrical GTO Thyristors", Materials Science Forum vols. 389-393, (2002), pp. 1349-1352.

Lendenmann et al, "High-Power SiC Diodes: Characteristics, Reliability and Relation to Material Defects", Materials Science Forum vols. 389-393, (2002), pp. 1259-1264.

Matsunami et al., "Step-Controlled Epitaxial Growth of SiC: High Quality Homoepitaxy", Materials Science and Engineering, R20, Reports: A Review Journal, (1997), pp. 125-166.

Zhang et al, "Transmission Electron Microscopy Investigation of Dislocations in Forward-biased 4H-SiC p-i-n Diodes", Applied Physics Letters AIP USA, vol. 83, No. 16, Oct. 20, 2003, pp. 3320-3322.

Saddow et al, "Thermal Capacitance Spectroscopy of Epitaxial 3C and 6H-Sic pn Junction Diodes Grown Side by Side on a 6H-SiC Substrate", Applied Physics Letters, AIP, American Institute of Physics, Melville, NY, vol. 66, No. 26, Jun. 26, 1995.

SILICON CARBIDE SEMICONDUCTOR DEVICE AND MANUFACTURING METHOD THEREFOR

This application is a divisional application of U.S. patent application Ser. No. 10/581,247 filed May 31, 2006, now U.S. Pat. No. 7,768,017 which is the U.S. national phase of international application PCT/JP2004/017888 filed 1 Dec. 2004, which designated the U.S. and claims benefit of JP 2003-405259 filed 3 Dec. 2003, the entire contents of each of which are hereby incorporated by reference.

TECHNICAL FIELD

An object of the technology disclosed herein is to provide a semiconductor device which has such high reliability that the forward voltage difference ΔVf representing forward voltage deterioration is not more than 1.0 V as well as a manufacturing method therefor.

BACKGROUND ART

Wide-gap semiconductor materials including silicon carbide (SiC) have such excellent characteristics as their high dielectric breakdown field strengths, which are about ten times higher than that of silicon (Si), and thus have been drawing attention as materials suitable for high withstand voltage bipolar power semiconductor devices having high withstand reverse voltage characteristics.

Bipolar semiconductor devices such as pin (Positive Intrinsic Negative) diodes, bipolar transistors, GTO (Gate Turn-Off Thyristor) and GCT (Gate-Commutated Thyristor), although high in built-in voltage as compared with unipolar semiconductor devices such as Schottky diode and MOSFET, yet have a characteristic that their on-resistance is largely decreased by conductivity modulation of the drift layer due to minority carrier injection. Accordingly, in high-voltage, large-current regions for power use or the like, bipolar semiconductor devices are used with a view to reducing losses. These bipolar semiconductor devices, when made from SiC, are enabled to implement far more excellent performance, compared with devices of Si. For example, a pin diode having a high withstand voltage of 10 kV and made from SiC has a forward voltage amounting to about one third that of Si pin diodes. The SiC pin diode shows a high-speed inverse recovery time, which represents operating speed at a turn-off, amounting to about ⅟20 or less of that of the Si pin diode. Also, the SiC pin diode shows a power loss amounting to about ⅕ or less of that of the Si pin diode, greatly contributing to energy saving. In addition to SiC pin diodes, SiC npn transistors, SiC SIAFETs, SiC SIJFETs and the like have been developed as well, and similar power loss reduction effects have been reported (e.g., non-patent document 1). Otherwise, SiC GTOs using a p-type semiconductor layer of inverse polarity as a drift layer have also been developed (e.g., non-patent document 2).

As described above, three example embodiments of bipolar semiconductor device have been described. However, the invention is not limited to the above Embodiments, but is applicable also to various kinds of 4H-SiC bipolar semiconductor devices such as SIAFETs, SIJFETs, thyristors, GTOs, MCTs (Mos Controlled Thyristors), SiCGT (SiC Commutated Gate Thyristors), ESTs (Emitter Switched Thyristors), and BRTs (Base Resistance Controlled Thyristors). Naturally, the invention can be modified and applied to various kinds of 4H-SiC bipolar devices such as opposite-polarity devices (e.g., pnp transistors for npn transistors), and further applicable to SiC bipolar devices using 6H-SiC or other crystal structures.

In SiC epitaxial growth, the CVD (Chemical Vapor Deposition) process, which allows easier control of the growth rate and the purity of the epitaxial layer, is used. However, since the CVD process employs hydrogen as the carrier gas, separation of carbon (C) from the growth surface occurs during the growth, causing the growth rate to be suppressed. Thus, the normal growth rate is 5 to 10 μm/h.

For fabrication of the conventional bipolar semiconductor device with SiC, for example, n-type 4H-SiC which has been formed so as to have a surface 1$a$ whose off-angle θ from the (0001) silicon surface 1 is 8 degrees is used for the substrate. In the term '4H', numeral '4' represents a crystal structure in which atomic layers are of a four-layer cycle, and 'H' refers to hexagonal crystal. On this substrate, a SiC drift layer for relaxation of electric field in voltage application is formed by epitaxial growth at a growth rate of 5 to 10 μm/h by using CVD process.

Non-patent document 1: Hiroyuki MATSUNAMI (editor and writer), "Semiconductor SiC technology and applications," edited and written by pp. 218-221, Nikkan Kogyo Shimbunsha.

Non-patent document 2: "A. K. Agarwal et. al, Materials Science Forum Volume 389-393, 2002, pp. 1349-1352.

DISCLOSURE OF THE INVENTION

In the conventional bipolar semiconductor device obtained in this way, as reported in Materials Science Forum Vols. 389-393 (2002), pp. 1259-1264, a phenomenon of a change with the lapse of time appears after energizing a new bipolar semiconductor device, the forward voltage increases with the lapse of time (operating time). This phenomenon is called "forward voltage deterioration." When a new bipolar semiconductor device is subjected to one-hour forward conduction with a current density of 100 A/cm², a forward voltage difference ΔVf at the current density of 100 A/cm² between a time point immediately after the start of conduction and another time point after one-hour conduction represents a degree of the forward voltage deterioration.

The forward voltage deterioration phenomenon occurs due to linear defects which are called basal plane dislocations and which propagate from the substrate to the drift layer. With this basal plane dislocation taken as a starting point, planar faults called stacking faults occur in the drift layer, causing the drift layer to be highly resistive with the result that the current does not easily flow.

In the case of conventional pin diodes, while the forward voltage at the forward current density of 100 A/cm² was 3.5 V in early stages of the use, it increases to 20 V after one-hour conduction at a current density of 100 A/cm², the forward voltage difference ΔVf being about 16.5 V. This causes a considerable increase in power loss inside the device so that the device could be broken by heat generated inside the device. SiC bipolar devices, although having greatly excellent initial characteristics as comprised with Si device, are considerably low in reliability because of the forward voltage deterioration. Therefore, it has been difficult to implement inverters or other power conversion units which are capable of elongated operating time, low in power loss and high in reliability.

SUMMARY

An object of the present invention is to provide a semiconductor device which has such high reliability that the forward voltage difference ΔVf representing forward voltage deterioration is not more than 1.0 V as well as a manufacturing method therefor.

In order to achieve the above object, there is provided a bipolar semiconductor device including:

a substrate in which a surface having a specified off-angle from a (000-1) carbon surface of a crystal of a first-conductive-type silicon carbide semiconductor whose base material is silicon carbide, which is a compound of carbon and silicon, is formed; and at least one drift layer which is formed on a crystal growth surface of the substrate at a specified formation rate with a first- or second-conductive-type silicon carbide semiconductor, where the surface of the substrate having the specified off-angle is taken as the crystal growth surface of the substrate.

According to the technology disclosed herein, since the first- and second-conductive-type silicon carbide semiconductor layers are formed as described above, semiconductor layers less liable to basal plane dislocation can be obtained. As a result, a pn junction diode which is less liable to forward voltage deterioration and long in service life can be obtained.

In one example embodiment the bipolar semiconductor device further includes at least one layer of a first- or second-conductive-type silicon carbide semiconductor formed on the drift layer.

According to the example embodiment, since the first- and second-conductive-type silicon carbide semiconductor layers are formed as described above, semiconductor layers less liable to basal plane dislocation can be obtained. As a result, a pn junction diode or a bipolar transistor which is less liable to forward voltage deterioration and long in service life can be obtained.

In one example embodiment, the substrate serves as a cathode and the bipolar semiconductor device further includes a semiconductor layer which is formed on the drift layer and which is of a second-conductive-type silicon carbide to serve as an anode.

According to the example embodiment, since the first- and second-conductive-type silicon carbide semiconductor layers are formed as described above, semiconductor layers less liable to basal plane dislocation can be obtained. As a result, a pn junction diode which is less liable to forward voltage deterioration and long in service life can be obtained.

Also, there is provided a bipolar semiconductor device including:

a substrate which is to serve as a collector and in which a surface having a specified off-angle from a (000-1) carbon surface of a crystal of a first-conductive-type silicon carbide semiconductor whose base material is silicon carbide, which is a compound of carbon and silicon, is formed;

a drift layer which is formed on a crystal growth surface of the substrate at a specified film growth rate by epitaxial growth of a first-conductive-type silicon carbide, where the surface of the substrate having the specified off-angle is taken as the crystal growth surface of the substrate;

a second-conductive-type base layer formed on the drift layer; and a first-conductive-type emitter layer formed on part of the base layer.

According to the bipolar semiconductor device, since the first- and second-conductive-type silicon carbide semiconductor layers are formed as described above, semiconductor layers less liable to basal plane dislocation can be obtained. As a result, an npn transistor which is less liable to forward voltage deterioration and long in service life can be obtained.

Also, there is provided a bipolar semiconductor device including:

a substrate which is to serve as a collector and in which a surface having a specified off-angle from a (000-1) carbon surface of a crystal of a first-conductive-type silicon carbide semiconductor whose base material is silicon carbide, which is a compound of carbon and silicon, is formed;

a drift layer which is formed on a crystal growth surface of the substrate at a specified film growth rate by epitaxial growth of a silicon carbide, where the surface of the substrate having the specified off-angle is taken as the crystal growth surface of the substrate;

a first-conductive-type grown layer formed on the drift layer;

a second-conductive-type emitter layer formed on the first-conductive-type grown layer;

a contact region formed by ion implantation into the first-conductive-type grown layer via a through hole formed in the second-conductive-type emitter layer; and a gate electrode formed via an insulating film on the first-conductive-type grown layer and the second-conductive-type emitter layer.

According to the bipolar semiconductor device, since the first- and second-conductive-type silicon carbide semiconductor layers are formed as described above, semiconductor layers less liable to basal plane dislocation can be obtained. As a result, an IGBT (Insulated Gate Bipolar Transistor) which is less liable to forward voltage deterioration and long in service life can be obtained.

In order to achieve the above object, there is provided a manufacturing method for a bipolar semiconductor device comprising the steps of:

forming a substrate by cutting a crystal of a first-conductive-type silicon carbide semiconductor whose base material is silicon carbide, which is a compound of carbon and silicon, by a surface having a specified angle with respect to a (000-1) carbon surface of the crystal;

forming a drift layer on a crystal growth surface of the substrate at a specified film growth rate by epitaxial growth of a first-conductive-type silicon carbide, where the surface of the substrate having the specified angle is taken as the crystal growth surface; and forming at least one layer of a first- or second-conductive-type silicon carbide semiconductor on the drift layer.

According to the manufacturing method, the off-angle is within a range of 2 to 10 degrees, and the film growth rate by epitaxial growth of silicon carbide that is to serve as the drift layer has a film-thickness increasing rate per hour h is 10 μm/h or more.

Therefore, supersaturation on the growth surface can be decreased so that propagation of the basal plane dislocation from the substrate to the epitaxial film can be suppressed. As a result, the forward voltage deterioration can be prevented.

According to the technology disclosed herein, since the propagation of the basal plane dislocation in the semiconductor layers is suppressed, forward voltage deterioration can be prevented. That is, the forward voltage difference ΔVf representing forward voltage deterioration can be suppressed to 1.0 V or less, so that a high-reliability bipolar device can be made up. With the use of such a high-reliability bipolar device, power conversion equipment, such as inverters, which are reduced in loss, capable of long-term operation and high in reliability can be implemented.

Figure 1:
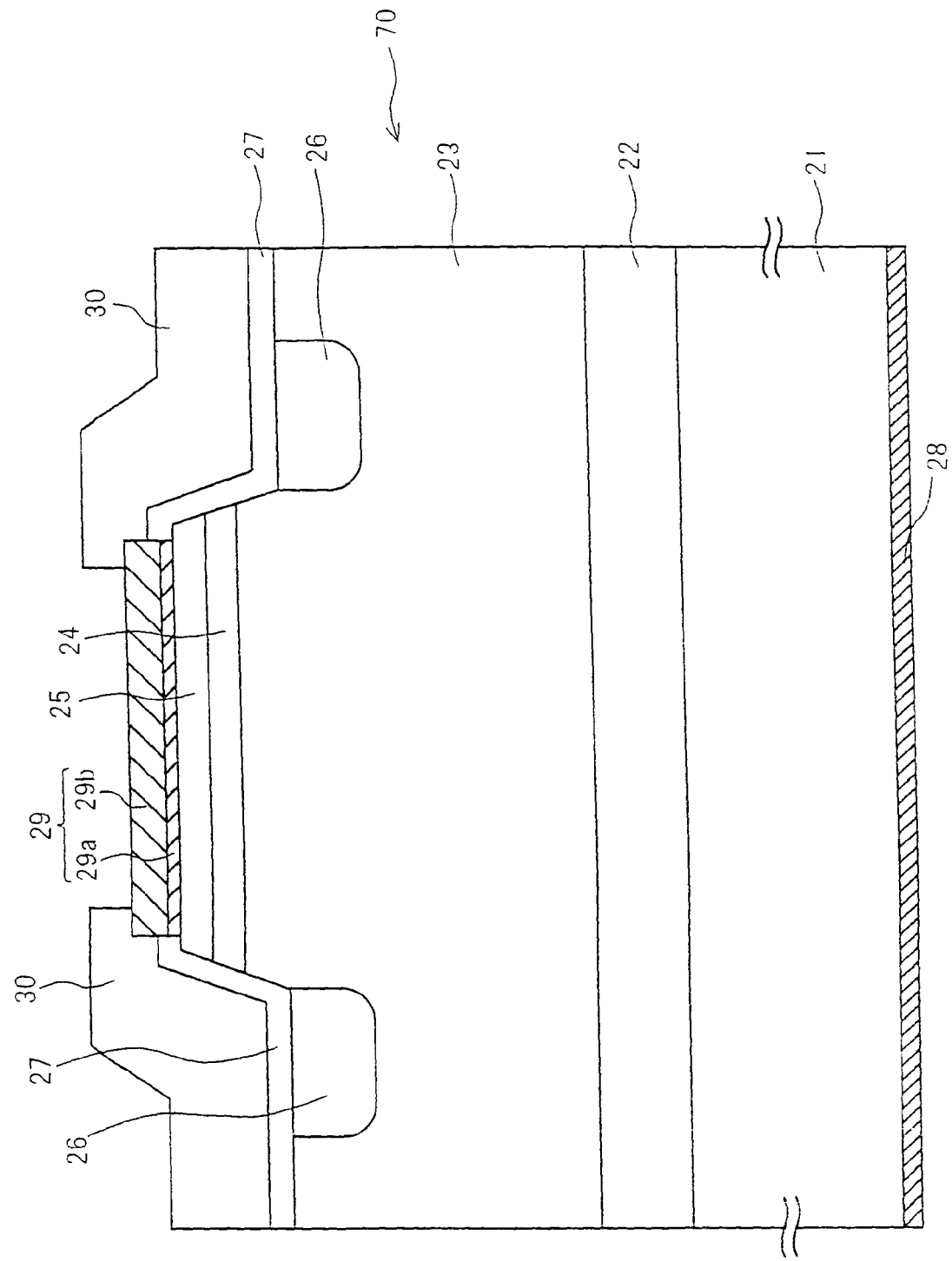
FIG. 1 is a sectional view of a pn (pin) diode which is a First Example Embodiment.

EXPLANATION OF REFERENCE NUMERALS 1 (0001) silicon surface
2 (000-1) carbon surface
3 substrate
22 buffer layer
23 drift layer
24 p-type junction layer
25 p+ type contact layer
26 JTE
27 thermal oxide film
28 cathode electrode
29 anode electrode
29a Ti layer
29b Al layer
50 npn bipolar transistor
51 substrate
52 buffer layer
53 drift layer
54 p-type grown layer
55 n-type grown layer
56 guard ring
57 contact region of base
58 oxide
59 collector electrode
60 IGBT
61 substrate
62 buffer layer
63 drift layer
64 n-type grown layer
65 p-type grown layer
66 contact region
66a hole
67 insulating film
68 gate electrode
68a hole
69 collector terminal
70 pin junction diode

DETAILED DESCRIPTION

Hereinbelow, an example embodiment will be described in detail. In the description of crystal lattice orientations and lattice surfaces, the following symbols, which are well known in the related technical fields, are used to represent lattice orientations and lattice surfaces. That is, an individual surface is expressed by ( ) and a set surface is by { }, where respective numerals are enclosed therein to represent individual surfaces. Also, whereas the negative index is represented by adding a "−" (bar) on a numeral in crystallography, it is impossible to added a bar above a numeral by software designated by JPO (Japanese Patent Office) and therefore a negative sign is added before a numeral for expression in this specification.

For suppression of the forward deterioration phenomenon, it is necessary to suppress propagation of the basal plane dislocation from the substrate to the drift layer as described before.

As a technique for forming the drift layer by SiC, epitaxial growth process is commonly used as reported in, for example, Materials Science and Engineering, R20 (1997) pp. 125-166. The epitaxial growth process includes, roughly, in two growth modes, step flow growth and two-dimensional nucleation growth.

The step flow growth is a growth along a direction parallel to a {0001} surface which is perpendicular to the growth axis of crystal, having a tendency to take over information attributed to the crystal parallel to the {0001} surface. The two-dimensional nucleation growth is a growth along a direction perpendicular to the {0001} surface, having a tendency to take over information attributed to the crystal oriented perpendicular to the {0001} surface and also causing a generating source of defects in crystal growth.

Therefore, in normal epitaxial growth, growth conditions are so set that the step flow growth progresses to some extent in order to obtain high-quality epitaxial film.

The basal plane dislocation is a dislocation present parallel to the {0001} surface and propagates along the same direction as the step flow growth. Accordingly, for suppression of the propagation of the basal plane dislocation, the step flow growth needs to be suppressed to such an extent that the two-dimensional nucleation does not occur.

Which growth goes, the step flow or the two-dimensional nucleation, depends largely on the supersaturation in crystal surfaces. When the supersaturation goes beyond a certain value (critical supersaturation), the two-dimensional nucleation growth goes. With the supersaturation under the certain value, the step flow growth goes. Therefore, given a large critical supersaturation, the two-dimensional nucleation is less likely to occur.

To obtain a large critical supersaturation, the growth rate is increased by, for example, increasing the feed amount of material gas, or by reducing the off-angle of the crystal to widen the terrace (flat portions) of a step present in crystal surfaces.

Figure 6:
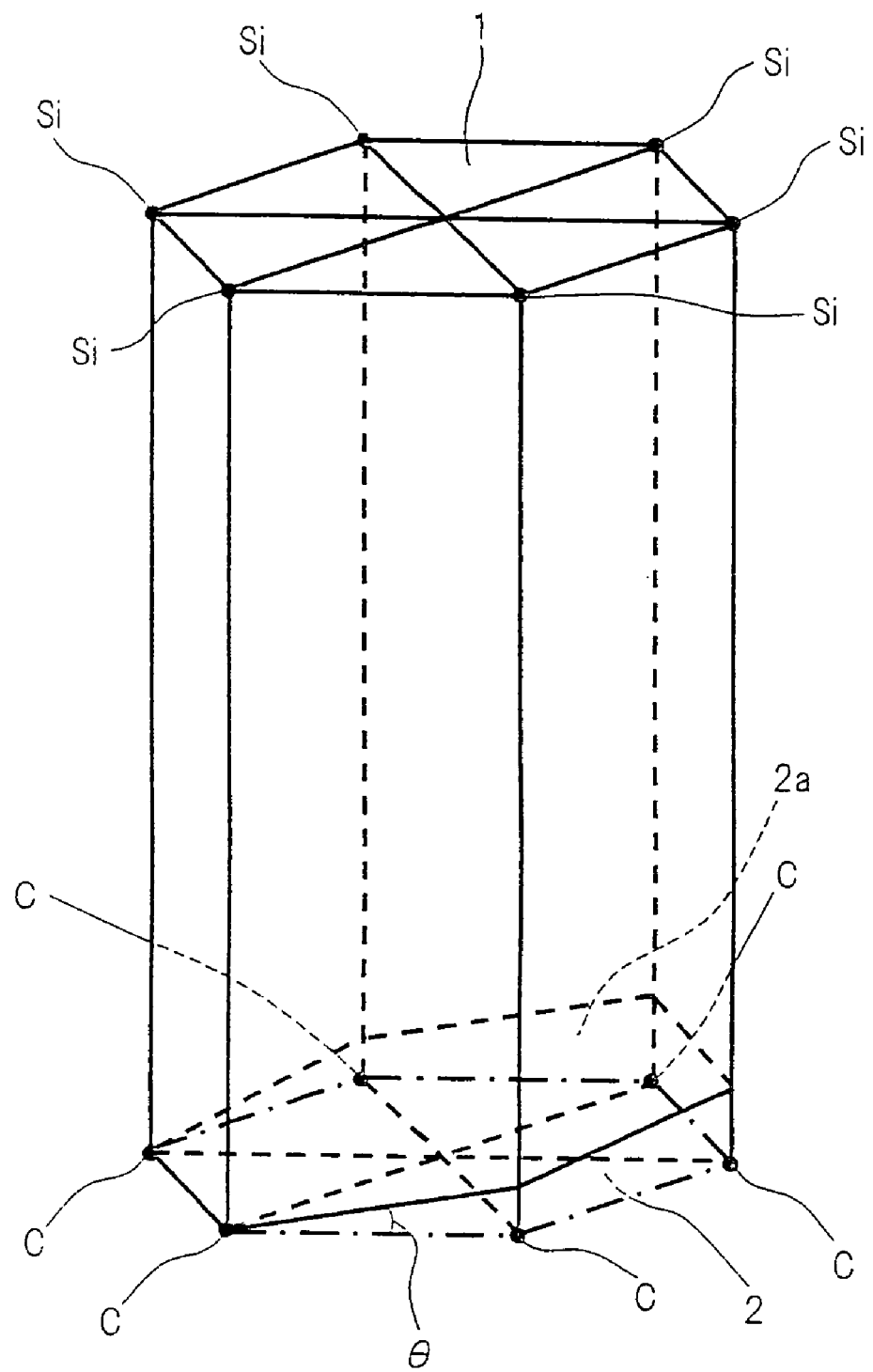
FIG. 6 is a perspective view showing a crystal of silicon carbide for a substrate of the bipolar semiconductor device.

In the SiC crystal shown in FIG. 6, the (000-1) carbon surface 2 is lower in surface energy by one order, therefore smaller in critical supersaturation value by one to two orders, than the (0001) silicon surface 1. As a result, its supersaturation becomes relatively smaller to a large extent.

For the (000-1) carbon surface 2, a step having a height equal to one molecular layer (not shown) is rather often adopted, where the molecular layer comprises a single Si—C layer. However, for the (0001) silicon surface 1, steps having a height of two or four molecular layers are observed. This shows that the terrace of the (000-1) carbon surface 2 becomes narrower in width to about half that of the (0001) silicon surface 1. As a result of this, the critical supersaturation value of the (000-1) carbon surface 2 is smaller than that of the (0001) silicon surface 1.

The critical supersaturation of the (000-1) carbon surface 2 depends largely on the growth rate, the degree of dependence being, larger than the degree of dependence on the width of the terrace of the step. Accordingly, the critical supersaturation of the (000-1) carbon surface 2 can relatively be increased by enhancing the growth rate. As a result of this, a step flow growth in which the two-dimensional nucleation growth can be suppressed and moreover propagation of the basal plane dislocation can be suppressed can be achieved.

In an example embodiment, semiconductor layers including an n-type layer, a p-type layer and the like constituting the SiC bipolar semiconductor device are formed on a surface $2a$ having a specified off-angle θ relative to the (000-1) carbon surface 2 of the SiC crystal. The off-angle θ is determined for an optimum angle within a range of 2 to 10 degrees depending on the type of the semiconductor device. According to an experiment by the inventors, successful results were obtained with an off-angle θ of about 8 degrees in the case of, for example, a pin diode. For an IGBT, successful results were obtained with an off-angle θ of about 3.5 degrees. Furthermore, the growth rate of the semiconductor layers is set faster than ordinary ones. The growth rate is desirably so set that the thin-film increasing amount per hour (h) becomes 10 μm/h or more. Depending on film growth conditions, the effect of the technology disclosed herein can be obtained even with film growth rates of 3 μm/h or more. In order to increase the growth rate, the amount of material gas to be fed during the film growth process is increased to a large extent.

Hereinbelow, preferred example embodiments are explained with reference to FIGS. 1 to 6.

First Embodiment

FIG. 1 is a sectional view of a pn (pin) junction diode which is a First Example Embodiment of a bipolar semiconductor device. In this Embodiment, semiconductor layers to be described below are formed on an n-type (first conductive type) 4H SiC substrate 21 whose surface orientation has an off-angle of 8 degrees from the (000-1) carbon surface. In the term "4H," the character "H" means hexagonal crystal and the numeral "4" means a crystal structure whose atomic lamination is four-layer cyclic. The C surface of the substrate 21 is a surface $2a$ having an off-angle θ of 8 degrees from the (000-1) carbon surface 2 of SiC crystal of FIG. 6. The film growth rate for each layer is 15 μm/h, where the increasing rate of film thickness per hour (h) is faster than in the conventional counterpart. Then, as described in detail below, n-type (first conductive type) 4H-SiC layer and p-type (second conductive type) 4H-SiC layer are epitaxially grown one by one, by which an epitaxial pin junction diode 70 is fabricated. A primary junction surface of the p-type layer and an i layer (insulating layer), and a primary junction surface (a surface extending in the horizontal direction in FIG. 1) of the i layer and the n-type layer, are both a {0001} surface.

For comparison with the epitaxial pin junction diode 70 of this Embodiment, the following one was fabricated as a comparative pin junction diode. That is, on an n-type 4H SiC surface $1a$ (hereinafter, referred to as Si surface) having an off-angle θ of 8 degrees from the (0001) silicon surface 1 shown in FIG. 7, a pin junction diode for comparison use is fabricated by making n-type 4H-SiC and p-type 4H-SiC epitaxially grown one by one at a growth rate having a film-thickness increasing rate per hour of 5 μm/h. The film growth rate of 5 μm/h is a common rate for manufacturing process of pin diodes. The pin junction diode of this Embodiment and the pin junction diode for comparison use are identical in size and configuration of their junction portion.

The n-type substrate 21 was fabricated by slicing an ingot grown by a modified Rayleigh method at an off-angle θ of 8 degrees, followed by specular polishing. The substrate 21 was determined by the Hall effect measuring method to have a carrier density of $8\times10^{18}$ cm$^{-3}$ and a thickness of 400 μm. On the substrate 21 serving as a cathode, a nitrogen-doped n-type SiC layer (n-type grown layer) and an aluminum-doped p-type SiC layer (p-type grown layer) are formed one by one in epitaxial growth by CVD process. By the n-type grown layer, an n-type buffer layer 22 and an n-type drift layer 23 shown in FIG. 1 are formed. The buffer layer 22 has a donor density of $7\times10^{17}$ cm$^{-3}$ and a film thickness of 10 μm. The buffer layer 22 is not necessarily required and not formed in some cases. The drift layer 23 has a donor density of about $5\times10^{15}$ cm$^{-3}$ and a film thickness of 40 μm. On the drift layer 23, a p-type junction layer 24 serving as an anode and a p$^+$-type contact layer 25 were formed one by one by the p-type grown layer. The p-type junction layer 24 has an acceptor density of $5\times10^{17}$ cm$^{-3}$ and a film thickness of 1.5 μm. The p$^+$-type contact layer 25 has an acceptor density of $1\times10^{18}$ cm$^{-3}$ and a film thickness of 0.5 μm. Processing conditions for the buffer layer 22, the drift layer 23, the p-type junction layer 24 and the p$^+$-type contact layer 25 to be formed one after another on the C surface of the substrate 21 are as follows.

Processing conditions for fabrication of the pin junction diode 70 of this Embodiment are explained in detail below. Silane (SiH$_4$) and propane (C$_3$H$_8$) are used as material gases. Nitrogen (N$_2$) and trimethylaluminum (Al(CH$_3$)$_3$) are used as dopant gases. Further, hydrogen (H$_2$) is used as the carrier gas. Flow rate of each gas is expressed in sccm (standard cc per minute) or slm (standard liter minute). Pressure is expressed in kPa (kilo Pascal). In the following description, a numerical value parenthesized and added after the name of each gas represents a flow rate. The substrate 21 is kept at a temperature of 1550° C., and the interior of the processing chamber is kept at a pressure of 5.6 kPa.

In a step for forming the buffer layer 22 on the C surface of the substrate 21, silane (30 sccm), propane (12 sccm), nitrogen (30 sccm) and hydrogen (10 slm) are fed. Processing time for this step is 40 minutes.

In a step for forming the drift layer 23, silane (30 sccm), propane (12 sccm), nitrogen (0.2 sccm) and hydrogen (10 slm) are fed. Processing time for this step is 160 minutes.

In a step for forming the p-type junction layer 24, silane (30 sccm), propane (12 sccm), trimethylaluminum (15 sccm) and hydrogen (10 slm) are fed. Processing time for this step is 6 minutes.

In a step for forming the p$^+$-type contact layer 25, silane (30 sccm), propane (12 sccm), trimethylaluminum (30 sccm) and hydrogen (10 slm) are fed. Processing time for this step is 2 minutes.

By the processing shown above, a SiC epitaxial wafer for the pin junction diode of this Embodiment is made up.

Next, processing conditions for fabrication of the pin diode for comparative use are described. Since its layers to be formed on the Si surface of the substrate are substantially similar in structure to those of this Embodiment shown in FIG. 1, same reference numerals are used in the description. The substrate is kept at a temperature of 1550° C., and the interior of the processing chamber is kept at a pressure of 5.6 kPa.

In a step for forming the buffer layer 22 on the Si surface of the substrate, silane (10 sccm), propane (3 sccm), nitrogen (10 sccm) and hydrogen (10 slm) are fed. Processing time for this step is 120 minutes.

In a step for forming the drift layer 23, silane (10 sccm), propane (3 sccm), nitrogen (0.07 sccm) and hydrogen (10 slm) are fed. Processing time for this step is 480 minutes.

In a step for forming the p-type junction layer 24, silane (10 sccm), propane (3 sccm), trimethylaluminum (5 sccm) and hydrogen (10 slm) are fed. Processing time for this step is 18 minutes.

In a step for forming the p+-type contact layer 25, silane (10 sccm), propane (3 sccm), trimethylaluminum (10 sccm) and hydrogen (10 slm) are fed. Processing time for this step is 6 minutes.

By the processing shown above, a SiC epitaxial wafer for the pin junction diode for comparative use is made up.

In a comparison of processing conditions between the SiC epitaxial wafer for the pin junction diode of this Embodiment and the SiC epitaxial wafer for the pin junction diode for comparative use, flow rates of the material gas and the dopant gas in the processing conditions of this Embodiment are three times or more higher than those of the conventional counterpart, respectively. Also, the processing time for each layer in this Embodiment is one third or less of the processing time of the comparative counterpart. As shown above, this Embodiment is characterized by shortened processing time and enhanced film growth rate.

The SiC epitaxial wafer of this Embodiment and the SiC epitaxial wafer for comparative use are subjected to processing described below, by which the pin junction diode 70 of this Embodiment shown in the figure as well as the pin junction diode for comparative use having a similar structure are made up.

First, both end portions of the SiC epitaxial wafer are removed by reactive ion etching (RIE) so as to be processed into a mesa structure. With $CF_4$ (carbon tetrafluoride) and $O_2$ used for RIE etching gas, the SiC epitaxial wafer was etched to a depth of about 2.5 μm by a plasma processing apparatus under the conditions of a pressure of 5 Pa and a high-frequency power of 260 W. In this case, a $SiO_2$ film (thickness: 10 μm) deposited by CVD was used as a mask material.

Next, for relaxation of electric field concentration at the bottom portion of the mesa formed by etching, a p-type JTE (Junction Termination Extension) 26 having a width of 250 μm and a depth of 0.7 μm was provided at mesa bottom portion. The JTE 26 was formed by Al ion implantation. The energy for the Al ion implantation was varied in six steps between 30 to 450 keV, where the total dose amount was $1.2 \times 10^{13}$ $cm^{-2}$. The JTE 26 was designed for its formation so that the implantation layer of the JTE 26 would become a box profile. The ion implantation was carried out throughout at room temperature, where graphite (thickness: 5 μm) was used as the mask for the ion implantation. Heat treatment for activation of implanted ions was carried out in an argon gas atmosphere with the conditions of 1700° C. and 3 minutes. After annealing, thermal oxide film 27 was formed as an overcoat by 3-hour wet oxidation at a temperature of 1200° C. Finally, a protective film 30 of polyimide resin was formed on the thermal oxide film 27 for completion.

Next, Ni (thickness: 350 nm) was formed on the underside of the substrate 21 to provide a cathode electrode 28. On the $p^+$-type contact layer 25, films of Ti (titanium with thickness 350 nm) and Al (aluminum with thickness 100 nm) were deposited, respectively, to provide an anode electrode 29. The anode electrode 29 was composed of a Ti layer 29a and an Al layer 29b. Finally, heat treatment was carried out at 1000° C. for 20 minutes, by which the cathode electrode 28 and the anode electrode 29 were made into ohmic electrodes, respectively. The pn junction was sized as 2.6 mm in diameter, and generally circular-shaped. Although the p-type JTE 26 was formed by aluminum ion implantation in this Embodiment, yet similar effects are achieved also by using ion implantation of boron (B). Further, in the pin junction diode 70, junction surfaces (surfaces extending horizontally in the figure) of the buffer layer 22, the drift layer 23, the p-type junction layer 24 and the p+-type contact layer 25 are all parallel to the surface 2a (in FIG. 6) having an off-angle of 8 degrees from the (000-1) carbon surface 2.

Of the pin junction diode 70 of this Embodiment, the withstand voltage is 3500 V and the on-voltage is 3.6 V. The pin junction diode 70 was subjected to one-hour conduction in the forward direction with a current density of 100 $A/cm^2$, and current-voltage characteristics at room temperature immediately after the start of the conduction and after the one-hour conduction were measured with a curve tracer.

Figure 2:
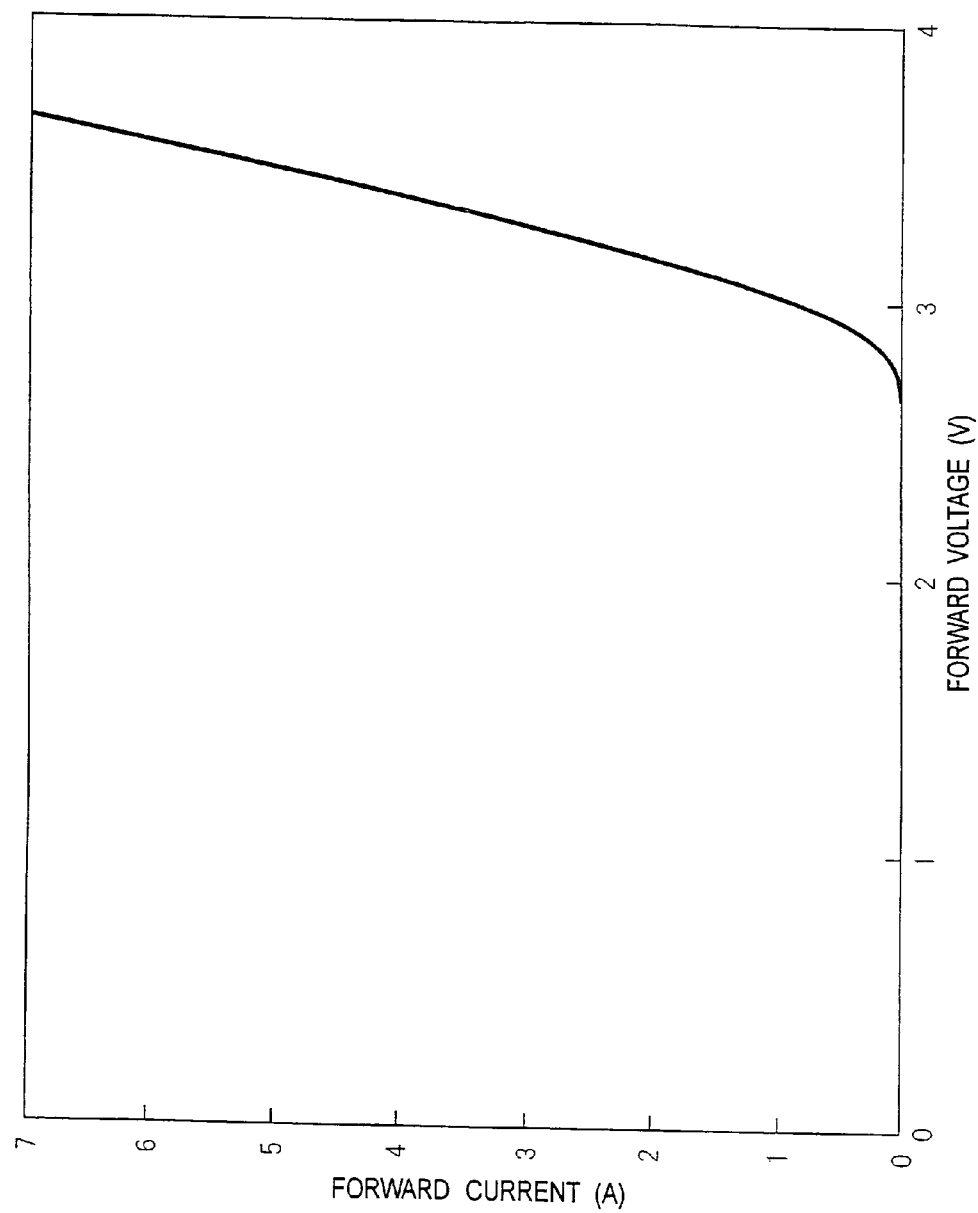
FIG. 2 is a graph showing current-voltage characteristics of the pin diode of the First Example Embodiment at a start of energizing and one hour after the energizing.

FIG. 2 is a graph showing forward current-voltage characteristics at room temperature of the pin junction diode 70 of this embodiment formed on the surface 2a of the n-type 4H SiC substrate (C surface) 21 whose surface orientation has an off-angle θ of 8 degrees from the (000-1) carbon surface 2.

A forward voltage difference ΔVf between immediately after the start of the conduction and after one-hour conduction with a forward current density of 100 $A/cm^2$ was not more than 0.1 V, hence almost no difference. Therefore, in the graph of FIG. 2, the current-voltage characteristics are represented by one curve. As can be understood from this result, the pin junction diode 70 of this Embodiment showed almost no deterioration even after the one-hour conduction.

Figure 3:
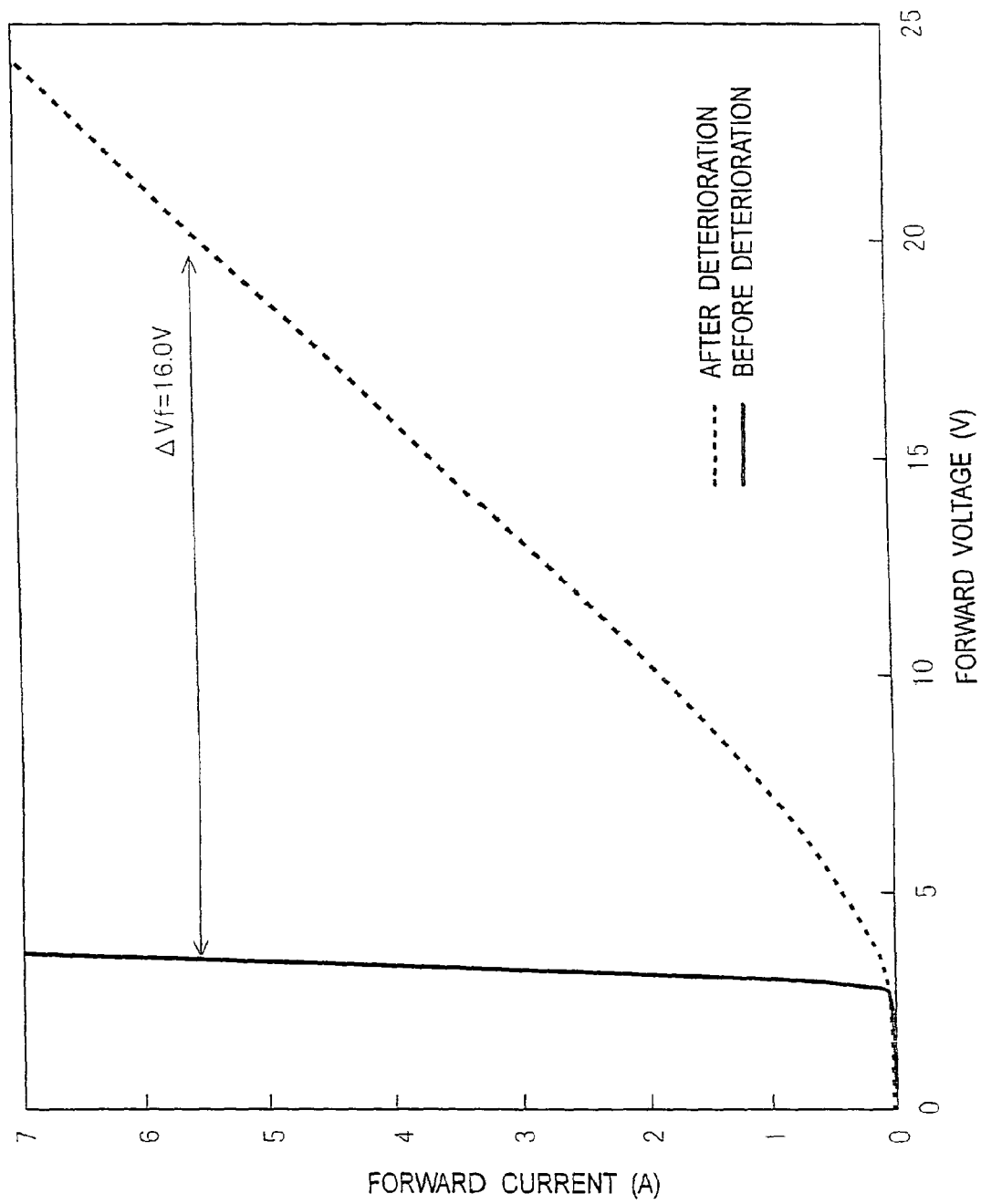
FIG. 3 is a graph showing current-voltage characteristics of a pin diode of the First Example Embodiment and a pin diode using a Si surface substrate made for comparison before deterioration, i.e. immediately after the conduction, and after deterioration, i.e. after the one-hour conduction.

FIG. 3 is a graph showing current-voltage characteristics obtained by a measurement of a comparative pin junction diode, which was fabricated in the same size for comparison with the pin junction diode 70 of this Embodiment, under the same conditions as in the pin junction diode 70 of this Embodiment. In FIG. 3, the curve of solid line shows a current-voltage characteristic immediately after the start of use (before deterioration) of the comparative pin junction diode. The curve of broken line shows a current-voltage characteristic after one-hour use (after deterioration). As can be understood from FIG. 3, the forward voltage difference ΔVf at a forward current density of 100 $A/cm^2$ (current value: 5.5 A) was 16.0 V. When the diode subjected to the conduction test was checked for photoluminescence emission which is known as a means for checking defects in the art, a large number of 422 nm emissions showing stacking faults were found in the comparative pin junction diode using the Si surface. On the other hand, no emission of stacking faults were found in the pin junction diode 70 using the C surface of this Embodiment.

As described above, the pin junction diode of SiC of this Embodiment, because of its being almost free from occurrence of forward voltage deterioration, becomes capable of long-term use, e.g., long service life. Since the pin junction diode is free from increases in on-resistance due to forward voltage deterioration, a high-reliability pin junction diode which is free also from internal loss and which is capable of maintaining stable characteristics for long time can be obtained.

Second Embodiment

Figure 4:
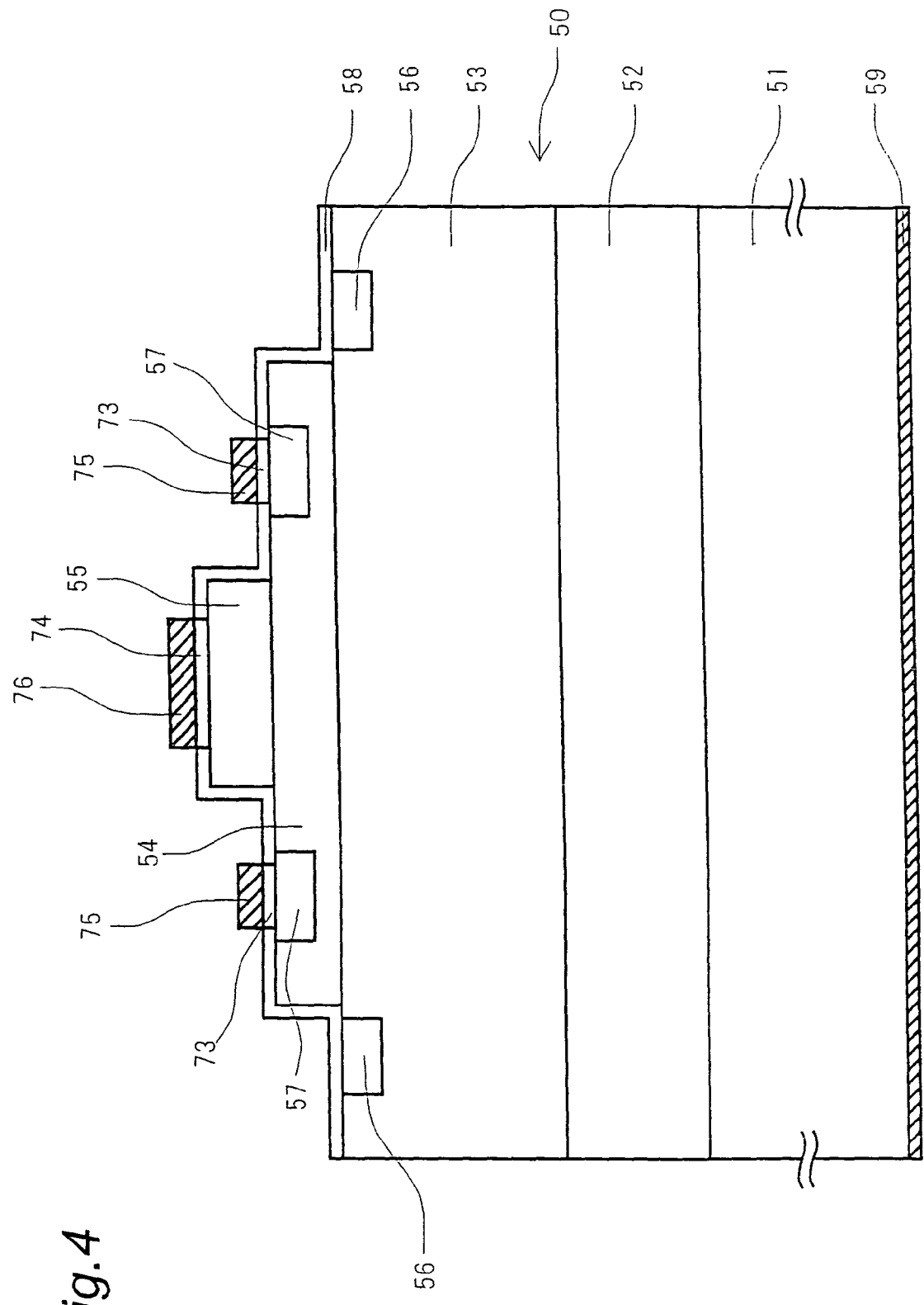
FIG. 4 is a sectional view of an npn bipolar transistor of a Second Example Embodiment.

FIG. 4 is a sectional view of an npn bipolar transistor 50 which is a Second Example Embodiment of a bipolar semiconductor device. In this embodiment also, as shown in FIG. 6, an n-type 4H SiC substrate having a surface 2a whose surface orientation has an off-angle θ of 8 degrees from the (000-1) carbon surface 2 (hereinafter, referred to as C surface) is used. On this substrate, n-type 4H-SiC, p-type 4H-SiC and n-type 4H-SiC are successively epitaxially grown in this order with a film-thickness increasing rate per hour (h) of 15 μm/h, by which an npn bipolar transistor 50 was fabricated.

Figure 7:
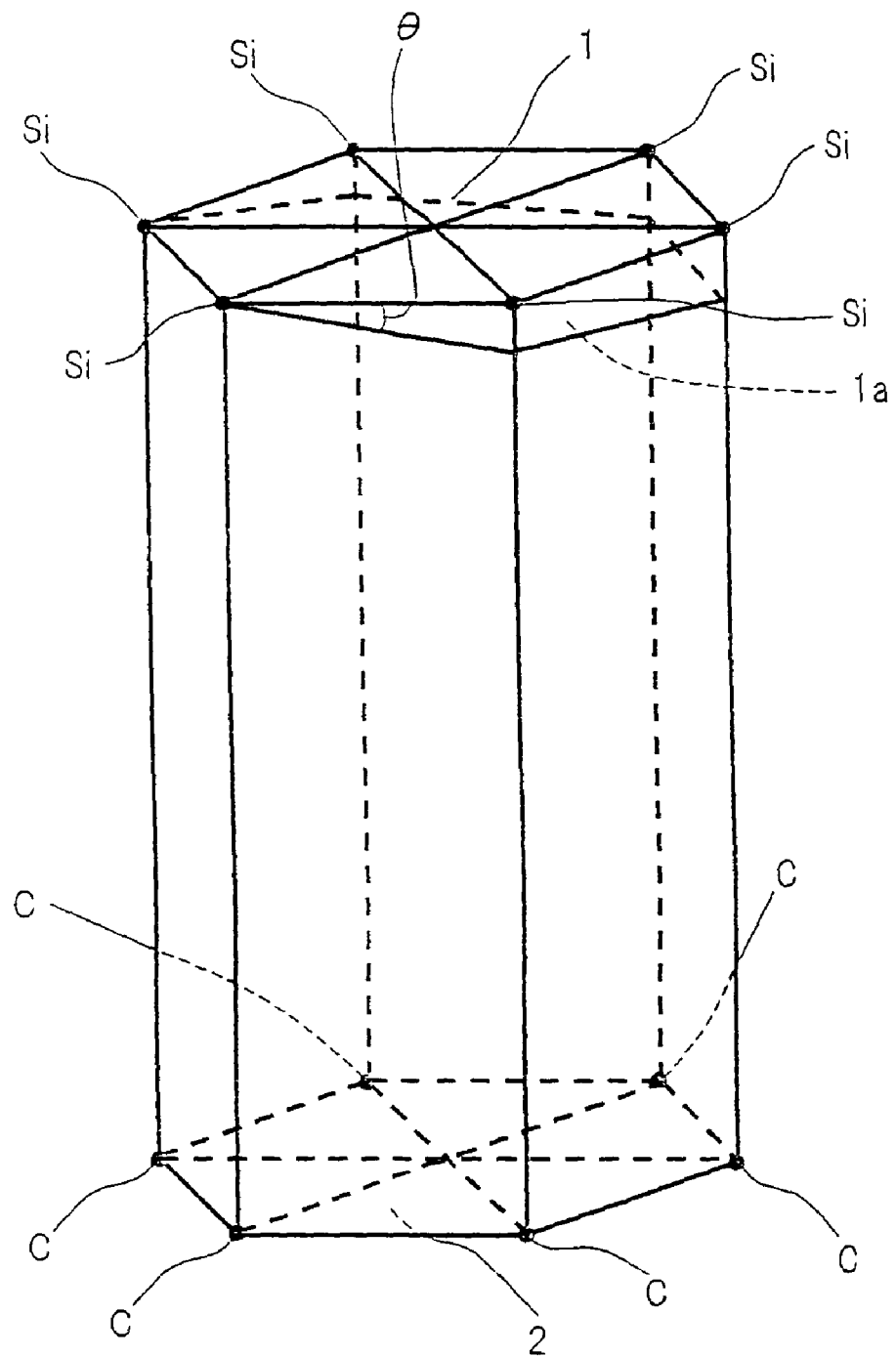
FIG. 7 is a perspective view showing a crystal of silicon carbide for a substrate of a conventional bipolar semiconductor device.

Also, n-type 4H-SiC having a surface 1a (hereinafter, referred to as Si surface) whose off-angle from the (0001)

silicon surface 1 shown in FIG. 7 was 8 degrees was used as the substrate for an npn bipolar transistor for comparison use. On this substrate, individual layers were grown with a film-thickness increasing rate per hour (h) of 5 μm/h. The primary junction surface (a surface extending horizontally in the figure) of the p and n layers is the (0001) surface.

A substrate 51 was fabricated by slicing an ingot grown by a modified Rayleigh method at an off-angle θ of 8 degrees, followed by specular polishing. The substrate 51 to serve as a collector, which was of the n-type, was determined by the Hall effect measuring method to have a carrier density of $8 \times 10^{18}$ cm$^{-3}$ and a thickness of 400 μm. On the C surface, a buffer layer 52 and a drift layer 53 of a nitrogen-doped n-type SiC layer were grown by CVD process. On the drift layer 53, a p-type grown layer 54 of aluminum-doped p-type SiC, and an n-type grown layer 55 of nitrogen-doped n-type SiC were grown one by one by epitaxial growth. The buffer layer 52 and the drift layer 53 serve as an n-type collector layer. The buffer layer 52 has a donor density of $7 \times 10^{17}$ cm$^{-3}$ and a film thickness of 10 μm. The drift layer 53 has a donor density of about $5 \times 10^{15}$ cm$^{-3}$ and a film thickness of 15 μm. Also, the p-type grown layer 54 serving as a p-type base layer has an acceptor density of $2 \times 10^{17}$ cm$^{-3}$ and a film thickness of 1 μm. The n-type grown layer 55 has a donor density of $7 \times 10^{17}$ cm$^{-3}$ and a film thickness of 0.75 μm. Processing conditions for the buffer layer 52, the drift layer 53, the p-type grown layer 54 and the n-type grown layer 55 are as follows.

Processing conditions for fabrication of the npn bipolar transistor 50 of this Embodiment are explained in detail below. Silane (SiH$_4$) and propane (C$_3$H$_8$) are used as material gases. Nitrogen (N$_2$) and trimethylaluminum (Al(CH$_3$)$_3$) are used as dopant gases. Further, hydrogen (H$_2$) is used as the carrier gas. A flow rate of each gas is expressed in sccm (standard cc per minute) or slm (standard liter minute). Pressure is expressed in kPa (kilo Pascal). In the following description, a numerical value parenthesized and added after the name of each gas represents a flow rate. The substrate 51 is kept at a temperature of 1550° C., and the interior of the processing chamber is kept at a pressure of 5.6 kPa.

In a step for forming the buffer layer 52 on the C surface of the substrate 51, silane (30 sccm), propane (12 sccm), nitrogen (30 sccm) and hydrogen (10 slm) are fed. Processing time for this step is 40 minutes.

In a step for forming the drift layer 53, silane (30 sccm), propane (12 sccm), nitrogen (0.2 sccm) and hydrogen (10 slm) are fed. Processing time for this step is 60 minutes.

In a step for forming the p-type junction layer 54, silane (30 sccm), propane (12 sccm), trimethylaluminum (6 sccm) and hydrogen (10 slm) are fed. Processing time for this step is 4 minutes.

In a step for forming the n-type grown layer 55, silane (30 sccm), propane (12 sccm), nitrogen (30 sccm) and hydrogen (10 slm) are fed. Processing time for this step is 3 minutes.

By the processing shown above, a SiC epitaxial wafer for the pin junction diode of this Embodiment is made up.

Next, processing conditions for fabrication of the npn bipolar transistor for comparative use are described. Since its layers to be formed on the Si surface of the substrate are substantially similar in structure to those of this Embodiment shown in FIG. 4, same reference numerals are used in the description. The substrate is kept at a temperature of 1550° C., and the interior of the processing chamber is kept at a pressure of 5.6 kPa.

In a step for forming the buffer layer 52 on the Si surface of the substrate, silane (10 sccm), propane (3 sccm), nitrogen (10 sccm) and hydrogen (10 slm) are fed. Processing time for this step is 120 minutes.

In a step for forming the drift layer 53, silane (10 sccm), propane (3 sccm), nitrogen (0.07 sccm) and hydrogen (10 slm) are fed. Processing time for this step is 180 minutes.

In a step for forming the p-type grown layer 54, silane (10 sccm), propane (3 sccm), trimethylaluminum (2 sccm) and hydrogen (10 slm) are fed. Processing time for this step is 12 minutes.

In a step for forming the n-type grown layer 55, silane (10 sccm), propane (3 sccm), nitrogen (10 sccm) and hydrogen (10 slm) are fed. Processing time for this step is 9 minutes.

By the processing shown above, a SiC epitaxial wafer for comparative use is made up. By subjecting the SiC epitaxial wafer of this Embodiment and the comparative SiC epitaxial wafer to the processing described below, respectively, an npn bipolar transistor 50 shown in FIG. 4 and a comparative npn bipolar transistor similar in structure thereto are made up.

First, the n-type grown layer 55 is etched by reactive ion etching (RIE) at a width of 10 μm, a depth of 0.75 μm and a pitch of 23 μm so that an n-type grown layer 55 to serve as an emitter is left. With CF$_4$ and O$_2$ used for RIE etching gas, the grown layer was etched under the conditions of a pressure of 0.05 Torr and a high-frequency power of 260 W. In this case, a SiO$_2$ film (thickness: 10 μm) deposited by CVD was used as a mask material.

Next, for execution of device isolation in the base region, a mesa structure was formed by reactive ion etching (RIE). With CF$_4$ and O$_2$ used for RIE etching gas, the mesa structure was etched to a depth of about 1 μm under the conditions of a pressure of 0.05 Torr and a high-frequency power of 260 W. In this case, a SiO$_2$ film (thickness: 10 μm) deposited by CVD was used as a mask material.

In this embodiment, a guard ring 56 for relaxation of electric field concentration at base end portions and a base contact region 57 were formed by Al (aluminum) ion implantation of the same process. The base contact region 57 is 3 μm wide with a spacing of 5 μm from the emitter, and the p-type guard ring 56 is 150 μm, where the depth of both is 0.5 μm. The energy for the Al ion implantation in the formation of the p-type guard ring 56 or the base contact region 57 is 40 to 560 keV, and the total dose amount is $1.0 \times 10^{13}$ cm$^{-2}$. A SiO$_2$ film (thickness: μm) formed by CVD was used as the mask for the ion implantation. The ion implantation was carried out throughout at room temperature, and heat treatment for activation of implanted ions was carried out in an argon gas atmosphere with a temperature of 1600° C. for 5 minutes. After annealing, thermal oxide film was formed by two-hour wet oxidation at a temperature of 1150° C., and further a SiO$_2$ film was deposited by CVD to form oxide film 58 of totally 2 μm.

Next, a collector electrode 59 was formed on the underside of the substrate 51. A base electrode 73 was formed in the base contact region 57. Further, an emitter electrode 74 was formed by deposition of Ni on the n-type grown layer 55. Subsequently, heat treatment was carried out at 1000° C. for 20 minutes, by which ohmic junctions were formed, respectively. Finally, the base electrode 73 and the emitter electrode 74 were covered with Ti/Au electrodes, by which electrode terminals 75, 76 were formed, respectively. The junction portion was sized as 3.2 mm×3.2 mm. Although the guard ring 56 was formed by Al ion implantation in this Embodiment, yet similar effects are achieved also by using ion implantation of boron (B). Further, in the npn bipolar transistor 50, junction surfaces (surfaces extending horizontally in the figure) of the substrate 51, the buffer layer 52, the drift layer 53, the p-type grown layer 54 and the n-type grown layer 55 are all parallel to the surface 2a having an off-angle of 8 degrees from the (000-1) carbon surface 2.

Of the fabricated npn bipolar transistor 50, the withstand voltage was 1400 V, the on-voltage was 8.0 mΩcm$^2$, and the maximum current amplification factor was about 12. The npn bipolar transistor 50 was subjected to one-hour conduction with a base current of 0.6 A and a collector current 7A (collector current density: 100 A/cm$^2$), and collector characteristics at room temperature before and after the conduction were measured with a curve tracer.

In the npn bipolar transistor 50 of this Embodiment, the on-resistance was 8.0 mΩcm$^2$ both immediately after the start of the conduction and after the one-hour conduction, hence almost no change in forward voltage.

The npn bipolar transistor of the comparative example was similarly subjected to a conduction test with a collector current density of 100 A/cm$^2$. The on-resistance of the comparative npn bipolar transistor at room temperature was 8.0 mΩcm$^2$ immediately after the start of the conduction, but greatly increased to 15.0 mΩcm$^2$ after the one-hour conduction. Further, the maximum current amplification factor of the comparative npn bipolar transistor was about 12 early in the conduction, but decreased to about 6 after the one-hour conduction.

In contrast to this, the maximum current amplification factor of the npn bipolar transistor of this Embodiment remain to be about 12 with almost no changes between immediately after the start of the conduction and after the one-hour conduction. As shown above, the npn bipolar transistor of this Embodiment showed almost no occurrence of forward voltage deterioration even after the one-hour conduction test.

Third Embodiment

Figure 5:
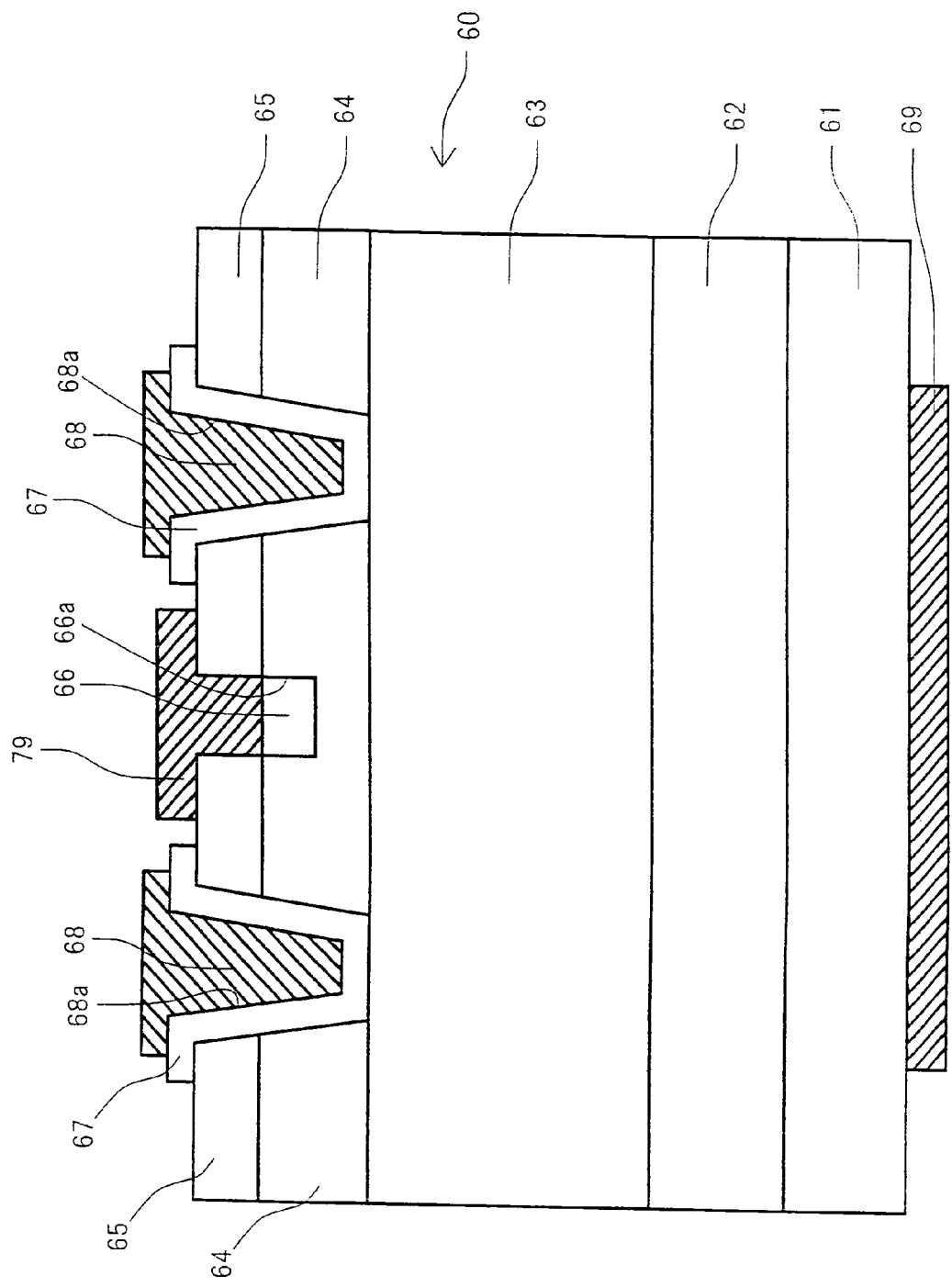
FIG. 5 is a sectional view of an IGBT for a Third Example Embodiment is formed.

A Third Example Embodiment relates to an IGBT (Insulated Gate Bipolar Transistor) which is a bipolar semiconductor device. FIG. 5 is a sectional view of an IGBT 60 of this Embodiment. In this Embodiment, a substrate (hereinafter, referred to as C surface substrate) using n-type 6H SiC whose surface orientation has an off-angle θ of 3.5 degrees from the (000-1) carbon surface 2 in FIG. 6 is prepared. On the substrate 61, three layers, i.e. a p-type 6H-SiC layer, an n-type 6H-SiC layer and a p-type 6H-SiC layer, are epitaxially grown in this order with a film-thickness increasing rate per hour (h) of 15 μm/h, by which an IGBT 60 is fabricated as is explained in detail below. The primary junction surface (a surface extending horizontally in the figure) of the p and n layers is the {0001} surface.

A comparative IGBT for comparison with the IGBT of this Embodiment is fabricated in the following way. A substrate (hereinafter, referred to as Si surface substrate) using n-type 6H SiC having a surface 1a whose surface orientation is an off-angle θ of 3.5 degrees from the (0001) silicon surface 1 in FIG. 7 is prepared. On this substrate, a p-type 6H-SiC layer, an n-type 6H-SiC layer and a p-type 6H-SiC layer are formed successively at a film growth rate of 5 μm/h.

The substrate 61 was fabricated by slicing an ingot grown by a modified Rayleigh method with a plane inclined by 3.5 degrees from the (000-1) carbon surface, followed by specular polishing. The substrate 61 to serve as a cathode, which was of the n-type and being 400 μm thick, was determined by the Hall effect measuring method to have a carrier density of 5×10$^{18}$ cm$^{-3}$. On this substrate, three layers, i.e. an aluminum-doped p-type SiC layer, a nitrogen-doped n-type SiC layer and an aluminum-doped p-type SiC layer, were grown successively by epitaxial growth by CVD process. The p-type SiC layer becomes a buffer layer 62 and a drift layer 63 of FIG. 5. buffer layer 62 has an acceptor density of 1×10$^{17}$ cm$^{-3}$ and a film thickness of 3 μm. The drift layer 63 has an acceptor density of about 5×10$^{15}$ cm$^{-3}$ and a film thickness of 15 μm. An n-type grown layer 64 to be formed on the drift layer 63 has a donor density of 2×10$^{17}$ cm$^{-3}$ and a film thickness of 2 μm. A p-type grown layer 65 to be formed on the n-type grown layer 64 has an acceptor density of 1×10$^{18}$ cm$^{-3}$ and a film thickness of 0.75 μm. Film growth conditions for the buffer layer 62, the drift layer 63, the n-type grown layer 64 and the p-type grown layer 65 are as follows.

Processing conditions for fabrication of the IGBT of this Embodiment are explained in detail below. Silane and propane ($C_3H_8$) are used as material gases. Nitrogen ($N_2$) and trimethylaluminum ($Al(CH_3)_3$) are used as dopant gases. Further, hydrogen ($H_2$) is used as the carrier gas. A flow rate of each gas is expressed in sccm (standard cc per minute) or slm (standard liter minute). Pressure is expressed in kPa (kilo Pascal). In the following description, a numerical value parenthesized and added after the name of each gas represents a flow rate. The substrate 61 is kept at a temperature of 1550° C., and the interior of the processing chamber is kept at a pressure of 5.6 kPa.

In a step for forming the buffer layer 62 on the C surface of the substrate 61, silane (30 sccm), propane (12 sccm), trimethylaluminum (3 sccm) and hydrogen (10 slm) are fed. Processing time for this step is 12 minutes.

In a step for forming the drift layer 63, silane (30 sccm), propane (12 sccm), trimethylaluminum (0.15 sccm) and hydrogen (10 slm) are fed. Processing time for this step is 60 minutes.

In a step for forming the n-type grown layer 64, silane (30 sccm), propane (12 sccm), nitrogen (9 sccm) and hydrogen (10 slm) are fed. Processing time for this step is 8 minutes.

In a step for forming the p-type grown layer 65, silane (30 sccm), propane (12 sccm), trimethylaluminum (30 sccm) and hydrogen (10 slm) are fed. Processing time for this step is 3 minutes.

By the processing shown above, a SiC epitaxial wafer for the pin junction diode of this Embodiment is made up.

Next, processing conditions for fabrication of the IGBT for comparative use are described. Since its layers to be formed on the Si surface of the substrate are substantially similar in structure to those of this Embodiment shown in FIG. 5, same reference numerals are used in the description. The substrate is kept at a temperature of 1550° C., and the interior of the processing chamber is kept at a pressure of 5.6 kPa.

In a step for forming the buffer layer 62 on the Si surface of the substrate, silane (10 sccm), propane (3 sccm), trimethylaluminum (1 sccm) and hydrogen (10 slm) are fed. Processing time for this step is 36 minutes.

In a step for forming the drift layer 63, silane (10 sccm), propane (3 sccm), trimethylaluminum (0.05 sccm) and hydrogen (10 slm) are fed. Processing time for this step is 180 minutes.

In a step for forming the n-type grown layer 64, silane (10 sccm), propane (3 sccm), nitrogen (3 sccm) and hydrogen (10 slm) are fed. Processing time for this step is 24 minutes.

In a step for forming the p-type grown layer 65, silane (10 sccm), propane (3 sccm), trimethylaluminum (10 sccm) and hydrogen (10 slm) are fed. Processing time for this step is 9 minutes.

By the processing shown above, a SiC epitaxial wafer for the comparative pin junction diode is made up. By subjecting the SiC epitaxial wafer of this Embodiment and the comparative SiC epitaxial wafer to the processing described below, respectively, an IGBT of this Embodiment shown in the figure and a comparative IGBT similar in structure thereto are made up.

Steps for fabricating the IGBT 60 shown in FIG. 5 from the resulting SiC epitaxial wafer are explained below.

First, a central portion of the p-type grown layer 65 is etched by RIE to provide a hole 66a with use of photolithography process. Nitrogen ions are implanted into the n-type grown layer 64 located at a bottom portion of the hole 66a, by which a contact region 66 to serve as a collector is formed.

For formation of a gate region, the p-type grown layer 65 and the n-type grown layer 64 are etched by RIE to form a hole 68a (two in FIG. 5). Subsequently, for formation of a MOS structure on the wall surface of the hole 68a, a $SiO_2$ film is deposited by CVD to form an insulating film 67.

Ni is deposited in the collector region of the substrate 61 to provide a collector terminal 69. Also, an emitter electrode 79 is deposited in the contact region 66. Next, heat treatment is carried out to form ohmic junctions, respectively. Further, a Mo electrode is formed on the insulating film 67 to provide a gate electrode 68.

Of the completed IGBT of this Embodiment and the comparative IGBT, the withstand voltage is 900 V. Their on-resistance is 11 $m\Omega cm^2$ and their collector-emitter voltage is −14 V. With a gate voltage of −40 V applied to the two IGBTs, one-hour conduction was carried out with a collector current of 1.4 A, and collector characteristics at room temperature at the time of start of the conduction and after the one-hour conduction were measured with a curve tracer. In the IGBT of this Embodiment, the collector-emitter voltage was −14 V both immediately after the start of the conduction and after the one-hour conduction, hence almost no change, making it found that there occurred no deterioration. In the comparative IGBT using a Si surface substrate, the collector-emitter voltage immediately after the conduction was −14 V, while the collector-emitter voltage after the one-hour conduction became as large as −29 V.

In order to check the state of deterioration, the gate electrode 68 and the emitter electrode 79 of the after-conduction IGBT were removed, and photoluminescence emission of SiC was examined. While a large number of emissions showing stacking faults were found in the after-conduction IGBT using the Si surface substrate, no emission of stacking faults were found in the IGBT using the C surface substrate.

As described above, three example embodiments of bipolar semiconductor device have been described. However, the invention is not limited to the above Embodiments, but is applicable also to various kinds of 4H-SiC bipolar semiconductor devices such as SIAFETs, SIJFETs, thyristors, GTOs, MCTs (Mos Controlled Thyristors), SiCGT (SiC Commutated Gate Thyristors), ESTs (Emitter Switched Thyristors), and BRTs (Base Resistance Controlled Thyristors). Naturally, the invention can be modified and applied to various kinds of 4H-SiC bipolar devices such as opposite-polarity devices (e.g., pnp transistors for npn transistors), and further applicable to SiC bipolar devices using 6H-SiC or other crystal structures.

INDUSTRIAL APPLICABILITY

The present invention can be used for SiC bipolar semiconductor devices which are less liable to a change with the lapse of time even if used for elongated time.

The invention claimed is:

1. A manufacturing method for a bipolar semiconductor device comprising the steps of:
    forming a substrate by cutting a crystal of a first-conductive-type silicon carbide semiconductor whose base material is silicon carbide, which is a compound of carbon and silicon, by a surface having a specified angle within a range of 2 to 10 degrees with respect to a (000-1) carbon surface of the crystal;
    forming a drift layer on a crystal growth surface of the substrate at a specified film growth rate by epitaxial growth of a first-conductive-type silicon carbide, where the surface of the substrate having said specified angle is taken as the crystal growth surface; and
    forming at least one layer of a first- or second-conductive-type silicon carbide semiconductor on the drift layer.

2. The bipolar semiconductor device manufacturing method as claimed in claim 1, wherein
    a film-thickness increasing rate per hour h in the step of forming the drift layer is 10 μm/h or more.

3. The bipolar semiconductor device manufacturing method as claimed in claim 1, further comprising a step of:
    forming a buffer layer between the substrate and the drift layer.

* * * * *